(12) United States Patent
Harazono

(10) Patent No.: US 9,159,715 B2
(45) Date of Patent: Oct. 13, 2015

(54) MINIATURIZED SEMICONDUCTOR DEVICE

(71) Applicant: Micro Module Technology Co., Ltd., Yokohama-shi, Kanagawa (JP)

(72) Inventor: Fumikazu Harazono, Yokohama (JP)

(73) Assignee: Micro Module Technology Co., Ltd., Yokohama-shi (JP)

( * ) Notice: Subject to any disclaimer, the term of this patent is extended or adjusted under 35 U.S.C. 154(b) by 0 days.

(21) Appl. No.: 14/236,228

(22) PCT Filed: Aug. 30, 2013

(86) PCT No.: PCT/JP2013/073335
§ 371 (c)(1),
(2) Date: Jan. 30, 2014

(87) PCT Pub. No.: WO2014/045842
PCT Pub. Date: Mar. 27, 2014

(65) Prior Publication Data
US 2015/0206864 A1    Jul. 23, 2015

(30) Foreign Application Priority Data
Sep. 19, 2012   (JP) .................... 2012-205618

(51) Int. Cl.
*H01L 25/18*      (2006.01)
*H01L 23/528*     (2006.01)
*H01L 23/367*     (2006.01)
*H01L 23/31*      (2006.01)
(Continued)

(52) U.S. Cl.
CPC ............ *H01L 25/18* (2013.01); *H01L 23/3107* (2013.01); *H01L 23/3675* (2013.01); *H01L 23/528* (2013.01); *H01L 29/7395* (2013.01); *H01L 29/7802* (2013.01); *H01L 29/7827* (2013.01); *H01L 29/861* (2013.01)

(58) Field of Classification Search
CPC ................. H01L 25/0657; H01L 2224/48091
USPC .................................. 257/329, 686
See application file for complete search history.

(56) References Cited

U.S. PATENT DOCUMENTS

2005/0224945 A1   10/2005   Saito et al.
2009/0302444 A1   12/2009   Ueda et al.
(Continued)

FOREIGN PATENT DOCUMENTS

JP   2005-302951 A   10/2005
JP   2006-134990 A    5/2006
(Continued)

OTHER PUBLICATIONS

International Search Report (PCT/ISA/210) dated Oct. 29, 2013 (Three (3) pages).
(Continued)

*Primary Examiner* — Mamadou Diallo
(74) *Attorney, Agent, or Firm* — Crowell & Moring LLP

(57) ABSTRACT

To realize further miniaturization of a semiconductor device. The semiconductor device 10 is provided with a switching element (FET 14) provided on a substrate 18, a first electrode (electrode 13) provided on an opposite side of the substrate 18 interposing the switching element, a diode 12 provided on an opposite side of the switching element interposing the first electrode, and a second electrode (electrode 11) provided on an opposite side of the first electrode interposing the diode 12.

20 Claims, 14 Drawing Sheets

(51) Int. Cl.
*H01L 29/78* (2006.01)
*H01L 29/739* (2006.01)
*H01L 29/861* (2006.01)

(56) References Cited

U.S. PATENT DOCUMENTS

2011/0096509 A1    4/2011    Yoshimochi
2012/0248521 A1*   10/2012    Herbsommer et al. ....... 257/299

FOREIGN PATENT DOCUMENTS

JP      2009-105389 A     5/2009
JP      2009-295794 A    12/2009
WO   WO 2009/020061 A1   2/2009

OTHER PUBLICATIONS

Japanese language Written Opinion (PCT/ISA/237) dated Oct. 29, 2013 (Four (4) pages).

* cited by examiner

[FIG. 13]
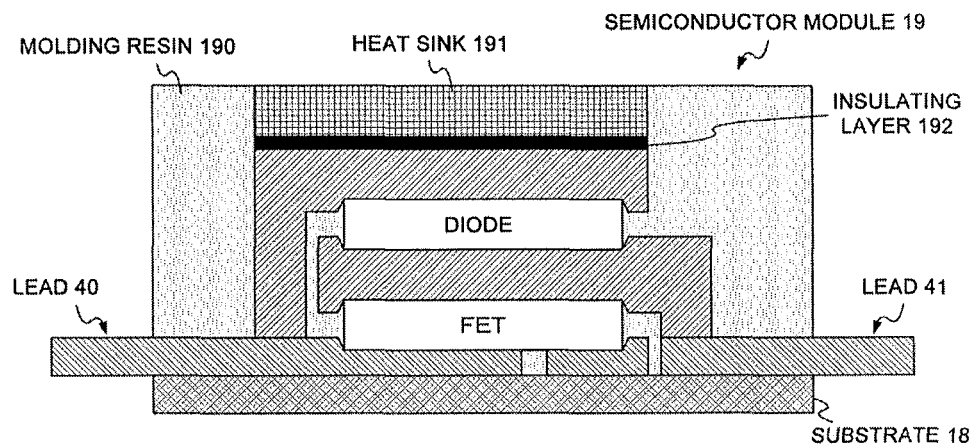

MINIATURIZED SEMICONDUCTOR DEVICE

FIELD OF THE INVENTION

The present invention relates to a semiconductor device. The present invention claims priority from Japanese Patent Application Number 2012-205618 filed on Sep. 19, 2012, and the content of that application is hereby incorporated by reference into the present application, for designated countries that recognize incorporation of documents by reference.

BACKGROUND OF THE INVENTION

A power module where a switching element, such as a MOSFET or the like, and a flywheel diode are disposed side by side on a single substrate is disclosed in Patent Document 1 below.

PRIOR ART DOCUMENTS

Patent Documents

Patent Document 1: Japanese Unexamined Patent Application Publication No. 2009-105389A

SUMMARY OF THE INVENTION

Description of the Related Art

However, higher component densities are required due to miniaturization and multifunction of products in recent years. Further miniaturization is also required for the power module described in Patent Document 1 above.

The present invention takes into account the above circumstances, and an object of the present invention is to realize further miniaturization of a semiconductor device.

Means to Solve the Problem

A first aspect to resolve the above problem is, for example, a semiconductor device, comprising: a field effect transistor (FET) provided on a substrate; a first electrode provided on an opposite side of the substrate interposing the FET; a diode provided on an opposite side of the FET interposing the first electrode; a second electrode provided on an opposite side of the first electrode interposing the diode; wherein the FET is formed in a plate-like shape having a source and a gate provided on one surface and a drain provided on another surface; the source is connected to a first wiring pattern on the substrate, the gate is connected to a second wiring pattern on the substrate, the drain is connected to the first electrode, a footing of the first electrode is connected to a different wiring pattern than the first wiring pattern and the second wiring pattern on the substrate; the diode is formed in a plate-like shape having an anode provided on one surface and a cathode provided on another surface, the cathode is connected to the first electrode, the anode is connected to the second electrode, a footing of the second electrode is connected to the first wiring pattern, and the footing of the first electrode and the footing of the second electrode oppose each other interposing the FET.

Further, a second aspect for resolving the above problems is, for example, a semiconductor device, comprising: a field effect transistor (FET) provided on a substrate; a first electrode provided on an opposite side of the substrate interposing the FET; a diode provided on an opposite side of the FET interposing the first electrode; and a second electrode provided on an opposite side of the first electrode interposing the diode; wherein the FET is formed in a plate-like shape having a source and a gate provided on one surface and a drain provided on another surface, the source is connected to a first wiring pattern on the substrate, the gate is connected to a second wiring pattern on the substrate, the drain is connected to the first electrode, the diode is formed in a plate-like shape having an anode provided on one surface and a cathode provided on another surface, the cathode is connected to the first electrode, the anode is connected to the second electrode, the second electrode is connected to the first wiring pattern, a surface of the first electrode connecting the diode to the first electrode is larger than the FET and the diode, a length of the cathode, in a cross section where the semiconductor device is cut on a plane orthogonal to the one surface of the FET including a line parallel to the side of the FET that passes through the source and gate, is longer than the sum of the lengths of the source and the gate.

A third aspect to resolve the above problems is, for example, a semiconductor device, comprising: a first field effect transistor (FET) provided on a substrate; a first electrode provided on an opposite side of the substrate interposing the first FET; a first diode provided on an opposite side of the first electrode; and a second electrode provided on an opposite side of the first electrode interposing the first diode; a second diode provided on an opposite side of the first diode interposing the second electrode; and a third electrode provided on an opposite side of the second electrode interposing the second diode; a second FET provided on an opposite side of the second diode interposing the third electrode; and a fourth electrode provided on an opposite side of the third electrode interposing the second FET; wherein the first and second FETs are formed in a plate-shape, respectively, with a source and gate provided on one surface and a drain provided on another surface, the source of the first FET is connected to a first wiring pattern provided on the substrate, the gate of the first FET is connected to a second wiring pattern provided on the substrate, the drain of the first FET is connected to the first electrode, a footing of the first electrode is connected to a different wiring pattern than the first wiring pattern and the second wiring pattern on the substrate, the source of the second FET is connected to the third electrode, the gate of the second FET is connected to a fifth electrode, and the drain of the second FET is connected to the fourth electrode; the first and second diodes are at least partially formed in a plate-shape, respectively, with an anode provided on one surface and a cathode provided on another surface, the cathode of the first diode is connected to the first electrode, the anode of the first diode is connected to the second electrode, the cathode of the second diode is connected to the second electrode, the anode of the second diode is connected to the third electrode, a footing of the second electrode is connected to the first wiring pattern, and a footing of the first electrode, the footing of the second electrode, and a footing of the fourth electrode oppose each other interposing the first FET, the second FET, the first diode, and the second diode.

A fourth aspect to resolve the above problems is, for example, a semiconductor device, comprising: a first field effect transistor (FET) provided on a substrate; a first electrode provided on an opposite side of the substrate interposing the first FET; a first diode provided on an opposite side of the first FET interposing the first electrode; a second electrode provided on an opposite side of the first electrode interposing the first diode; a second diode provided on an opposite side of the first diode interposing the second electrode; a third electrode provided on an opposite side of the second electrode interposing the second diode; a second FET provided on an opposite side of the second diode interposing the third electrode; and a fourth electrode provided on an opposite side of the third electrode interposing the second FET; wherein the first and second FETs are formed in a plate-shape, respectively, with a source and gate provided on one surface and a drain provided on another surface, the source of the first FET is connected to a first wiring pattern provided on the substrate, the gate of the first FET is connected to a second wiring pattern provided on the substrate, the drain of the first FET is connected to the first electrode, the source of the second FET is connected to the third electrode, the gate of the second FET is connected to a fifth electrode, and the drain of the second FET is connected to the fourth electrode; the first and second diodes are at least partially formed in a plate-shape, respectively, with an anode provided on one surface and a cathode provided on another surface, the cathode of the first diode is connected to the first electrode, the anode of the first diode is connected to the second electrode, the cathode of the second diode is connected to the second electrode, the anode of the second diode is connected to the third electrode, the second electrode, the fourth electrode, and the first wiring pattern are connected; and a surface of the first electrode connecting the first diode to the first electrode is larger than the first FET and the first diode, and the length of the cathode of the first diode, in a cross-section where the semiconductor device is cut on a plane orthogonal to the one surface of the first FET including a line parallel to a side of the first FET and that passes through the source of the first FET and the gate of the first FET, is longer than the sum of the lengths of the source of the first FET and of the gate of the first FET.

Effects of the Invention

The present invention can realize further miniaturization of a semiconductor device having a switching element and a diode.

BRIEF DESCRIPTION OF THE DRAWINGS

FIG. 13 is a cross-sectional view illustrating another example of the structure of the semiconductor module 19.

DETAILED DESCRIPTION OF THE INVENTION

Embodiments of the present invention will be described hereinafter with reference to drawings.

Figure 1A:
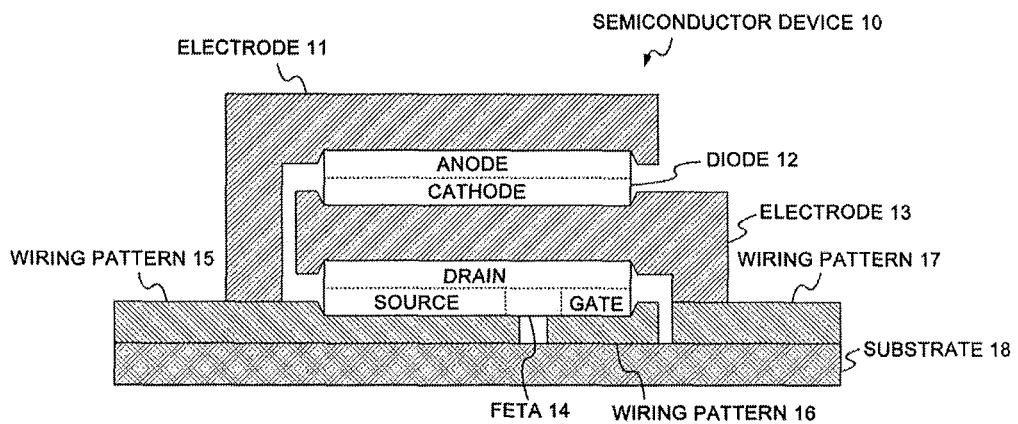
FIG. 1A is a cross-sectional view and FIG. 1B is a plan view illustrating one example of a structure of a semiconductor device 10 according to one embodiment of the present invention.
Figure 1B:
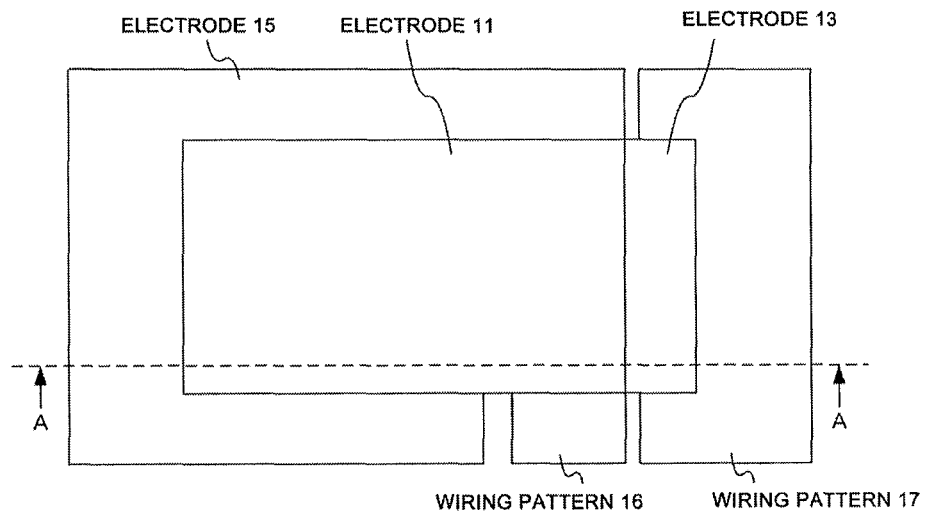

FIG. 1A is a cross-sectional view and FIG. 1B is a plan view illustrating one example of a structure of a semiconductor device 10 according to one embodiment of the present invention. FIG. 1A is a cross-sectional diagram along the line A-A of the semiconductor device 20 of FIG. 1B. The semiconductor device 10 is provided with an electrode 11, a diode 12, an electrode 13, a field effect transistor (FET) 14, a wiring pattern 15, a wiring pattern 16, a wiring pattern 17, and a substrate 18. The FET 14 is one example of a switching element.

Figure 2:
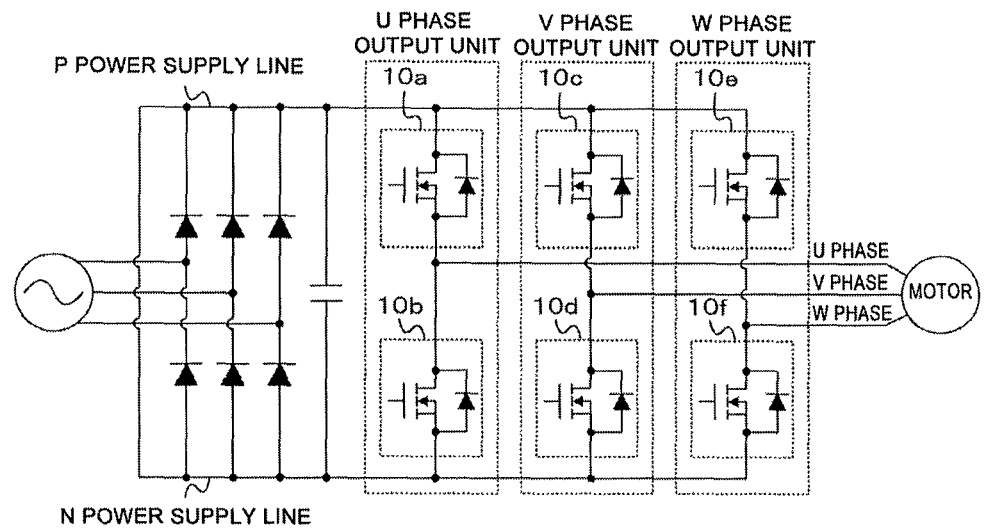
FIG. 2 is a circuit diagram illustrating one example of circuits used in the semiconductor device 10.

The semiconductor device 10 illustrated in this embodiment can be used in a circuit such as that illustrated for example in FIG. 2. The circuit illustrated in FIG. 2, is a power converter circuit configured of a three-phase pulse width modulation (PWM) inverter, and has a U phase output unit, V phase output unit, and W phase output unit provided respectively between a P power supply line, which is a high voltage DC power supply line, and an N power supply line, which is a low voltage DC power supply line.

The U phase output unit, V phase output unit, and the W phase output unit have two sets each of semiconductor devices 10 connected in parallel to the switching element (FET) and to the diode, respectively. With each of the semiconductor devices 10, the drain of the FET and the cathode of the diode are connected, and the source of the FET and the anode of the diode are connected.

Each of the gates of the FET are controlled On/Off by a control circuit, and direct current supplied from the P power supply line and the N power supply line is converted to alternating current and supplied to the motor to drive the motor.

The description will continue returning to FIG. 1. The wiring pattern 15, the wiring pattern 16, and the wiring pattern 17 using, for example, Cu (copper) and the like, are formed on the substrate 18. The substrate 18 is preferably formed of ceramics such as aluminum nitride, for example, to have high thermal conductivity and high insulating properties. Further, the substrate 18 may be formed of metal, such as copper or aluminum, having high thermal conductivity, but when doing so, an insulating layer of, for example, aluminum nitride, is formed on the substrate 18 with the wiring patterns 15 to 17 provided thereon.

Figure 3:
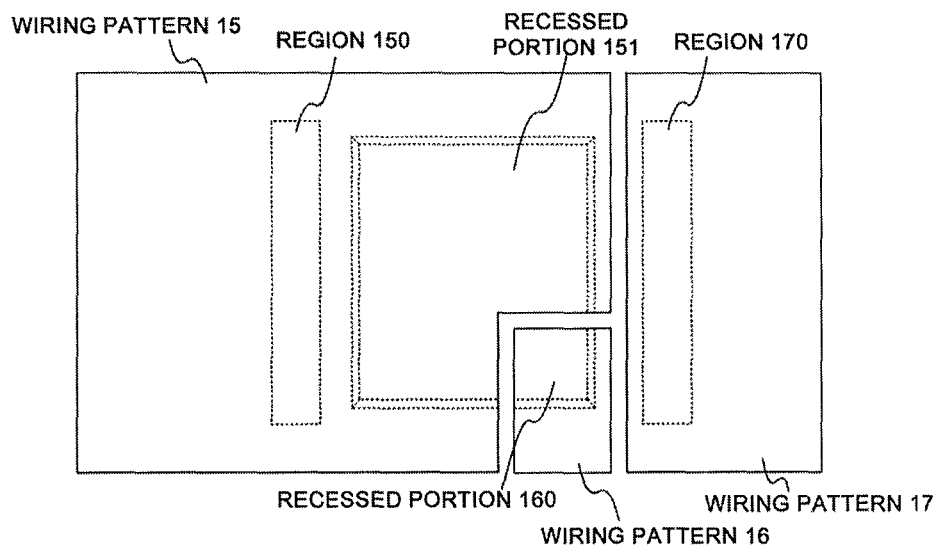
FIG. 3 is a conceptual diagram illustrating one example of a wiring pattern 15, a wiring pattern 16, and a wiring pattern 17 provided on a substrate 18.

A recessed portion 151 and a recessed portion 160 are respectively provided on the wiring pattern 15 and the wiring pattern 16 along a region where the FET 14 is disposed as illustrated in FIG. 3 for example. The recessed portion 151 is formed thinner than other regions of the wiring pattern 15, and the recessed portion 160 is formed thinner than other regions of the wiring pattern 16.

Providing the recessed portion 151 and the recessed portion 160 not only improves precision of positioning when placing the FET 14 on the wiring pattern 15 and the wiring pattern 16, but can also prevent misalignment of the FET 14 on the wiring pattern 15 and on the wiring pattern 16 when further placing other components on the FET 14.

Furthermore, when placing the FET 14 after a conductive bonding agent such as nano silver paste has been applied onto the wiring pattern 15 and the wiring pattern 16, providing the recessed portion 151 and the recessed portion 160 can prevent the conductive bonding agent from leaking into other regions on the wiring pattern 15 or on the wiring pattern 16.

Figure 4A:
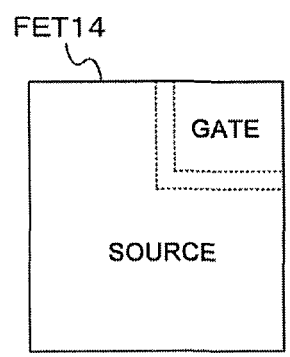
FIG. 4 is a conceptual diagram for explaining one example of a structure of a FET 14.
Figure 4B:
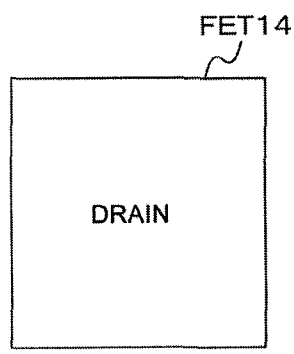

The FET 14 is formed, for example, in a plate-like shape and is provided with, as illustrated in FIG. 4, a gate and source on one surface and a drain on another surface. In this embodiment, SiC (silicon carbide) is preferably used as the material for the FET 14.

The source of the FET 14 is bonded to the recessed portion 151 of the wiring pattern 15, and the gate of the FET 14 is bonded to the recessed portion 160 of the wiring pattern 16, by the conductive bonding agent. A nano metallic paste (for example nano silver paste) or a soldering paste it may be used as a conductive bonding agent.

Figure 5A:
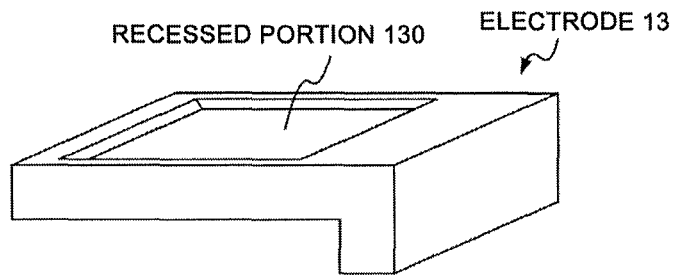
FIG. 5 is a conceptual diagram for explaining one example of a shape of an electrode 13.
Figure 5B:
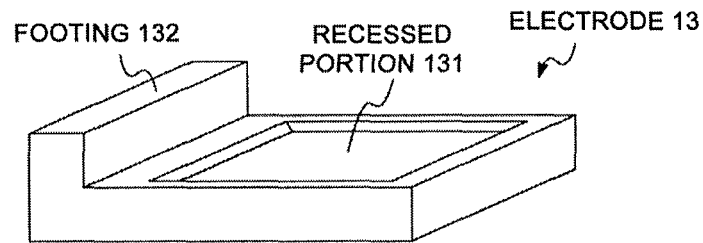

The electrode 13 is formed of, for example, Cu or the like, in a shape illustrated in, for example, FIG. 5. For example, a recessed portion 130 such as that illustrated in FIG. 5A is formed on a surface of the electrode 13 connecting to the diode 12, and a recessed portion 131 such as that illustrated in FIG. 5B, for example, is formed on a surface connecting to the FET 14.

Furthermore, the recessed portion 131 is bonded to the drain of the FET 14, and the footing 132 is bonded to the region 170 of the wiring pattern 17, by the conductive bonding agent such as a nano silver paste. The recessed portion 131 is bonded to the FET 14 on a surface (more preferably the entire surface) where, for example, the drain of the FET 14 is provided.

The diode 12 is formed, for example, in a plate-like shape, and is provided with an anode on one surface and a cathode on another surface. In this embodiment, SiC (silicon carbide) is preferably used as the material for the diode 12.

Furthermore, the cathode of the diode 12 is bonded to the recessed portion 130 of the electrode 13 by the conductive bonding agent such as a nano silver paste. The diode 12 is bonded to the recessed portion 130 on a surface (more preferably the entire surface) where, for example, the cathode of the diode 12 is provided.

Providing the recessed portion 130 and the recessed portion 131 of the electrode 13 not only improves the positioning precision between the electrode 13 and the FET 14, and the positioning precision between the electrode 13 and the diode 12, but can prevent the conductive bonding agent from leaking into other regions on the electrode 13.

Figure 6A:
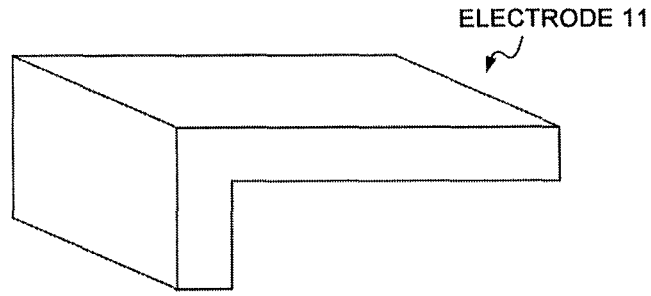
FIG. 6 is a conceptual diagram for explaining one example of a shape of an electrode 11.
Figure 6B:
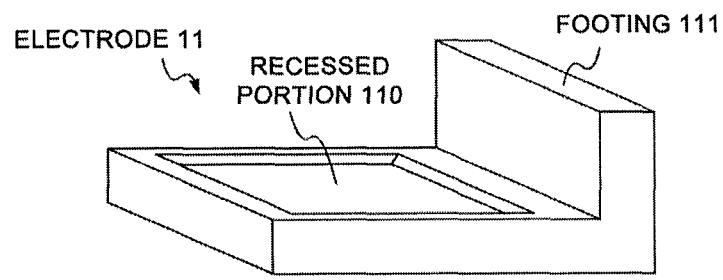

The electrode 11 is formed of, for example, Cu or the like, in a shape illustrated in, for example, FIG. 6. A recessed portion 110 such as that illustrated in, for example, FIG. 6B is formed on a surface of the electrode 11 connecting to the diode 12.

Furthermore, the recessed portion 110 is bonded to the surface where the anode of the diode 12 is provided, and the footing 111 is bonded to the region 150 of the wiring pattern 15, by the conductive bonding agent such as a nano silver paste. The footing 111 is preferably bonded to the diode 12 on a surface (more preferably the entire surface) where, for example, the anode of the diode 12 is provided.

Providing the recessed portion 110 of the electrode 11 not only improves the positioning precision between the electrode 11 and the diode 12, but can prevent the conductive bonding agent from leaking into other regions on the electrode 13.

In this manner, the semiconductor device 10 of this embodiment, because it is configured by stacking the diode 12 and the FET 14 with the electrode 13 therebetween, can reduce the mounting area more than a structure of a conventional power module which disposes the diode 12 and FET 14 horizontally next to each other on the substrate, and can therefore be miniaturized.

Further, stacking the diode 12 and FET 14 shortens the wiring more than when disposing horizontally next to each other on the substrate, and therefore, loss due to heat resistance of the wiring can be reduced thereby enabling a reduction in generated heat and an improvement in power efficiency to be realized.

Further, the diode 12 and the FET 14 in this embodiment may be produced using SiC (silicon carbide), and when doing so, operation at high temperature (for example, approximately 300° C.) becomes possible compared to when standard silicon is used in production.

Here, when producing the diode and FET using silicon, normal operation can only be done within a temperature range of up to approximately 150° C. Therefore, if the circuit is configured using this diode 12 and FET 14, use of a cooling device is necessary so that the temperature increase of all circuits is less than 150° C. which may cause the device to increase in size and become more complex.

In contrast to this, with the semiconductor device 10 of this embodiment, use of SiC (silicon carbide) in the diode 12 and the FET 14 enables operation at a high temperature thereby eliminating the need for a large scale cooling device and making miniaturization and simplification of the device possible.

Further, an operating temperature range of up to approximately 150° C. with circuits using a conventional diode and FET produced from silicon allowed wire bonding to be used for wiring of the diode and the FET. However, when using SiC (silicon carbide) in the diode 12 and FET 14 as in this embodiment, the diode 12 and FET 14 can be operated at temperatures of approximately 300° C.

In such a case, the wire may fuse if wire bonding is performed on the wiring. In contrast to that, with the semiconductor device 10 of this embodiment, the diode 12 and the FET 14 are not connected by a wire but by a broad electrode and wiring pattern, and therefore, even if the diode 12 or the FET 14 reaches a temperature of approximately 300° C. during operation, the connected state can be maintained without wire breakage.

Further, even though, with wire bonding, it is possible to reduce the amount of current flowing per wire by increasing the number of wires to reduce overall wire resistance and prevent fusing of the wire, there is a limit to how much the capillaries of the bonder can be reduced, requiring a certain amount of distance between wires, and therefore the number of wires cannot be increased much (or else the number of wires must be increased by increasing the area of the terminal). Further, increasing the number of wires also increases the time required for wiring labor.

In contrast to this, with the semiconductor device 10 of this embodiment, with the physical semiconductor device 10 of this embodiment, the diode 12 and the FET 14 are not connected by wires but by a broad electrode and wiring pattern, and therefore wiring with low resistance is possible.

Further, although the FET 14 is used as one example of a switching element in this embodiment, a bi-polar transistor, such as an insulated gate bipolar transistor (IGBT) or the like may be used in other embodiments instead of the FET 14. When providing the IGBT instead of the FET 14, in FIG. 1, a base is connected to the wiring pattern 16, an emitter is connected to the wiring pattern 15, and a collector is connected to the electrode 13, respectively.

Figure 7:
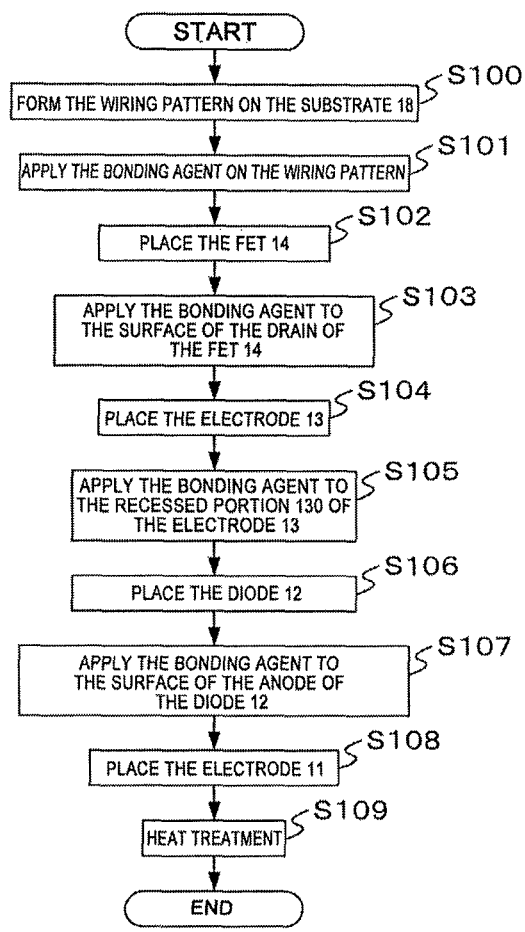
FIG. 7 is a flowchart illustrating one example of the manufacturing process of the semiconductor device 10.

FIG. 7 is a flowchart illustrating one example of the manufacturing process of the semiconductor device 10.

First, as illustrated, for example, in FIG. 3, the wiring pattern 15, wiring pattern 16, and the wiring pattern 17 are formed by, for example, plating or sputtering using Cu or the like on the substrate 18, and the recessed portion 151 and the recessed portion 160 are formed by, for example, etching or the like (S100).

Next, the conductive bonding agent, such as nano silver paste, is applied to the wiring pattern 15, wiring pattern 16, and the wiring pattern 17 (S101). More specifically, the conductive bonding agent, such as nano silver paste, is applied to the region 150 and the recessed portion 151 of the wiring pattern 15, the recessed portion 160 of the wiring pattern 16, and to the region 170 of the wiring pattern 17.

Figure 8:
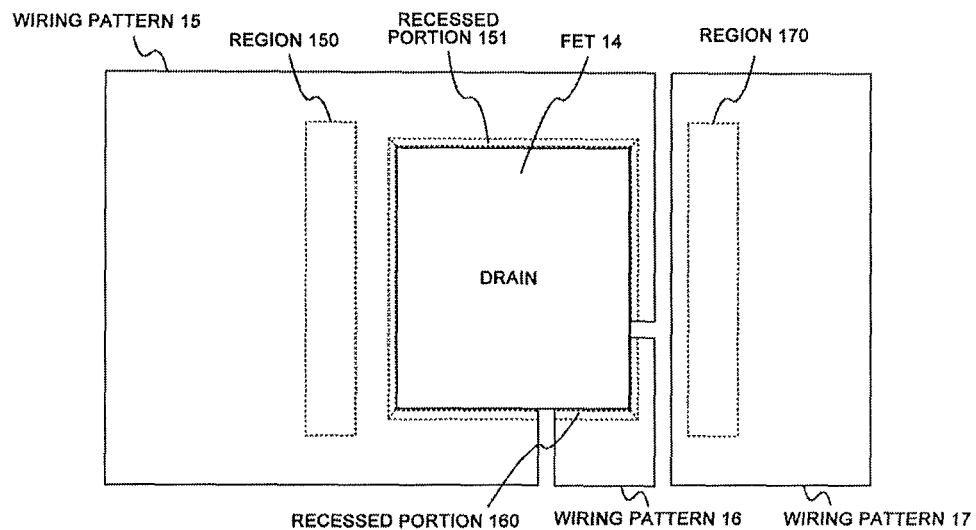
FIG. 8 is a conceptual diagram for explaining one example of the FET 14 disposed on the wiring pattern 15 and the wiring pattern 16.

Next, the FET 14 is placed on the wiring pattern 15 and the wiring pattern 16, to which the conductive bonding agent has been applied (S102). More specifically, the source of the FET 14 is placed on the recessed portion 151 of the wiring pattern 15, and the gate of the FET 14 is placed on the recessed portion 160 of the wiring pattern 16 to make, for example, a state such as that illustrated in FIG. 8.

Next, the conductive bonding agent, such as nano silver paste, is applied to the surface of the drain of the FET 14 (S103).

Figure 9:
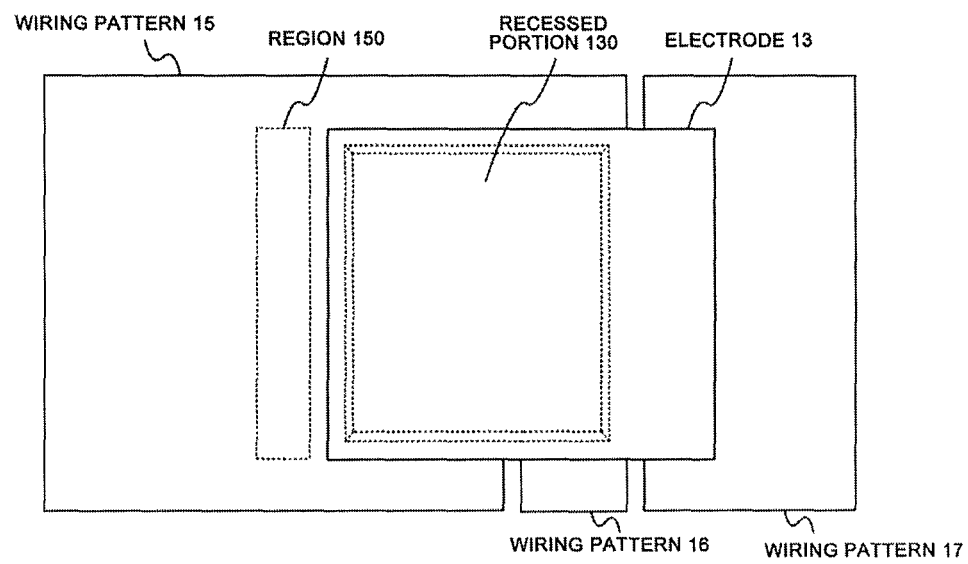
FIG. 9 is a conceptual diagram for explaining one example of the electrode 13 disposed on the FET 14 and a wiring pattern 17.

Next, the electrode 13 is placed on the FET 14 and on the wiring pattern 17 (S104). More specifically, the recessed portion 131 of the electrode 13 is placed on the surface of the drain of the FET 14, and the footing 132 of the electrode 13 is placed on the region 170 of the wiring pattern 17 to make, for example, a state such as that illustrated in FIG. 9.

Next, the conductive bonding agent, such as nano silver paste, is applied to the recessed portion 130 of the electrode 13 (S105).

Figure 10:
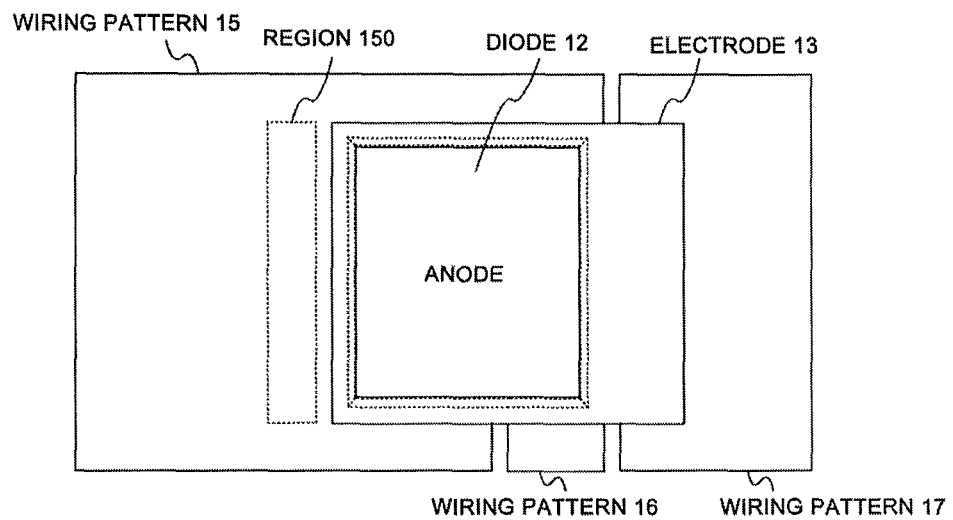
FIG. 10 is a conceptual diagram for explaining one example of a diode 12 disposed on the electrode 13.

Next, the diode 12 is placed on the recessed portion 130 of the electrode 13 (S106). More specifically, a surface of the cathode of the diode 12 is placed on the recessed portion 130 of the electrode 13 to make, for example, a state such as that illustrated in FIG. 10.

Next, the conductive bonding agent, such as nano silver paste, is applied to the surface of the anode of the diode 12 (S107).

Next, the electrode 11 is placed on the diode 12 and on the wiring pattern 15 (S108). More specifically, the recessed portion 110 of the electrode 11 is placed on the surface of the anode of the diode 12, and the footing 111 of the electrode 11 is placed on the region 150 of the wiring pattern 15 to make, for example, a state such as that illustrated in FIG. 1B.

Next, the semiconductor device 10, in its entirety, undergoes heat treatment to solidify the conductive bonding agent such as nano silver paste (S109), and the manufacturing process of the semiconductor device 10 shown in the flowchart is completed.

An embodiment of the present invention is described above.

As is evident from the above description, with the semiconductor device 10 of this embodiment, further miniaturization of a semiconductor device having a switching element and a diode can be realized.

Figure 11:
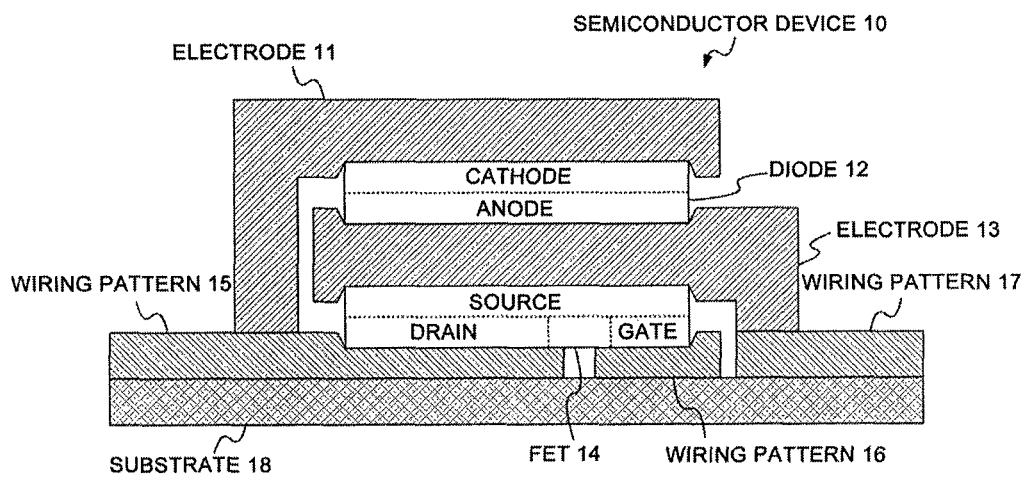
FIG. 11 is a cross-sectional view illustrating another example of a structure of the semiconductor device 10.

Note that the semiconductor device in the embodiment described may configure, for example, the semiconductor device 10 as illustrated in FIG. 11 by providing the source and drain of the FET 14 on opposite surfaces and attaching the diode 12 opposite.

Figure 12A:
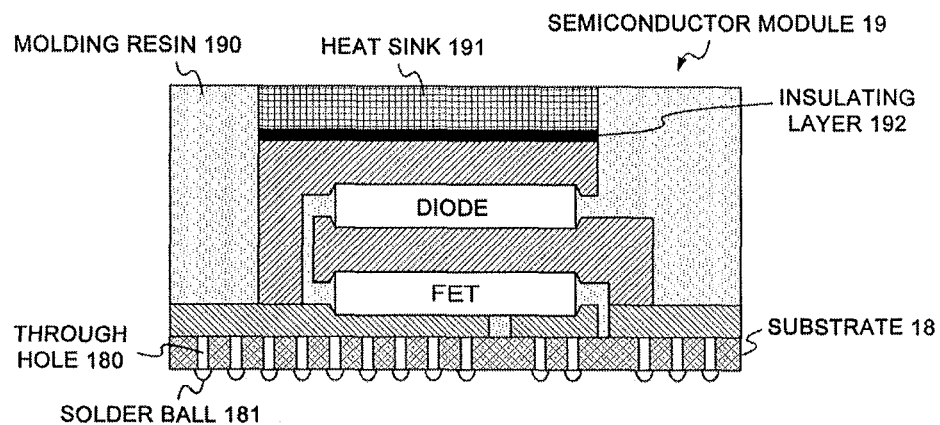
FIG. 12A is a cross-sectional view and FIG. 12B is a bottom view illustrating one example of a structure of a semiconductor module 19.
Figure 12B:
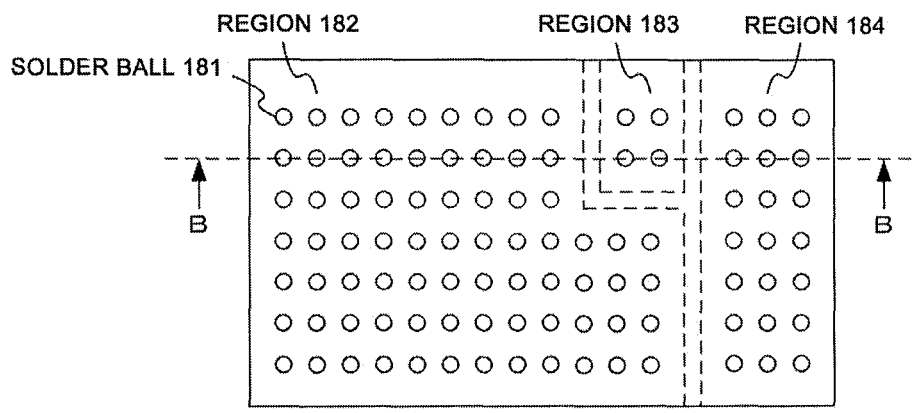

Further, the semiconductor device 10, as illustrated in FIG. 12 for example, may be configured as a semiconductor module 19 that provides an insulating layer 192, such as a resin with high insulating properties, on the electrode 11, a heat sink 191 thereon, and sealing the entirety with a molding resin 190. FIG. 12B is a bottom view of the semiconductor module 19, and FIG. 12A is a cross-sectional view of FIG. 12B along the line B-B.

Note that, in the heat sink 191, the surface on the opposite side of the surface contacting the insulating layer 192 is exposed to the outer part of the semiconductor module 19. Therefore, making the heat sink 191 to contact a metal enclosure or the like of the device where the semiconductor module 19 is installed enables heat from the semiconductor module 19 to be more efficiently released outside. Further, in the heat sink 191 increasing the surface area by providing unevenness or fins on the surface on the opposite side of the surface in contact with the insulating layer 192 enables heat from the semiconductor module 19 to be more efficiently released outside.

With the semiconductor module 19 illustrated in FIG. 12, a plurality of through holes 180 are provided on the substrate 18, and solder balls 181 are provided for connection to the respective through holes 180 on the opposite side of the surface of the substrate 18 where the wiring pattern is provided.

The solder balls 181 of the through holes 180 connected to the wiring pattern 15 are disposed on a region 182, the solder balls 181 of the through holes 180 connected to the wiring pattern 16 are disposed on a region 183, and the solder balls 181 of the through holes 180 connected to the wiring pattern 17 are disposed on a region 184. With this type of configuration, the semiconductor module 19 can be easily surface mounted on another circuit board.

Further, the semiconductor device 10, as illustrated in FIG. 13 for example, may be configured as the semiconductor module 19 that provides the heat sink 191 via the insulating layer 192 on the electrode 11 with the entirety sealed with a molding resin 190, and providing a lead 40 and a lead 41 that connect to wiring patterns on the substrate 18. In the example in FIG. 13, a lead is also provided connected to the wiring pattern 16 of the gate of the FET 14.

Further, in the embodiment described above, providing the recessed portions on the electrode 11, the electrode 13, a wiring pattern 15, and the wiring pattern 16, improves positioning precision of the diode 12 and the FET 14 as well as prevents misalignment during the manufacturing process, and dams the conductive bonding agent, such as nano silver paste and the like, from leaking into other areas, but the present invention is not limited to this.

Figure 14A:
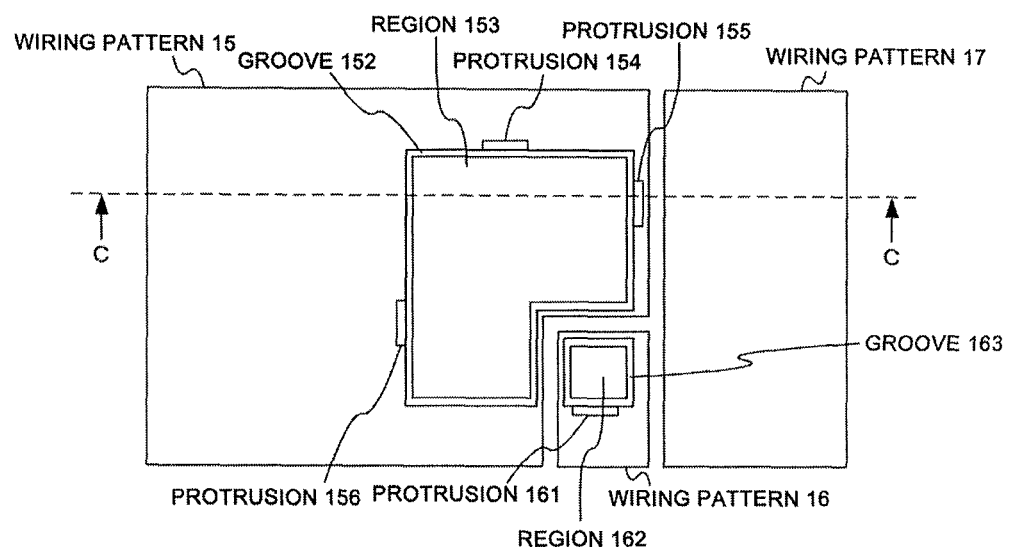
FIG. 14A is a plan view and FIG. 14B is a cross-sectional view illustrating one example of a protrusion and a groove provided on the wiring pattern 15 and the wiring pattern 16.
Figure 14B:
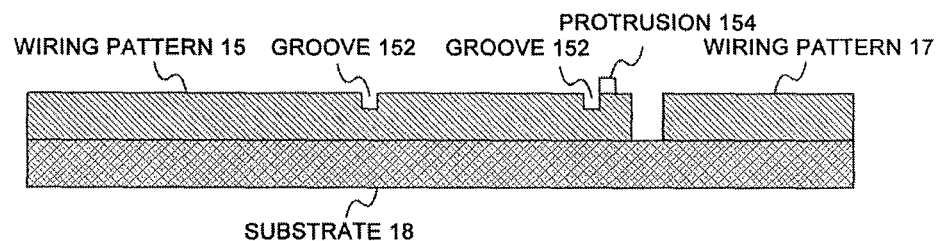

For example, as illustrated in FIG. 14, grooves and protrusions may be provided on a wiring pattern and electrode. FIG. 14A is a plan view of the wiring pattern 15, the wiring pattern 16, and the wiring pattern 17, and FIG. 14B is a cross-sectional view of FIG. 14A along the line C-C.

In the example illustrated in FIG. 14, a groove 152 is provided along the region 153 where the source of the FET 14 is disposed for the wiring pattern 15, and the protrusion 161 is provided along the region 162 where the gate of the FET 14 is disposed for the wiring pattern 16.

Providing this type of groove allows the prevention of the conductive bonding agent, such as a nano silver paste or the like, from leaking into other regions to be realized. Note that the groove is not required to completely enclose the region 153 where the source of the FET 14 is disposed and the region 162 where the gate of the FET 14 is disposed, but the groove may be provided for a portion where there is concern for shorting or the like due to leaking of the conductive bonding agent, such as where the distance to other signal lines is short, or the like.

In the example illustrated in FIG. 14, protrusions 154 to 156 may be provided along the region 153 where the source of the FET 14 is disposed for the wiring pattern 15, and the protrusion 161 may be provided along the region 162 where the gate of the FET 14 is disposed for the wiring pattern 16.

The example of the protrusions 154 to 156 in FIG. 14 shows the length in the direction along the region 153 to be longer than the height from the wiring pattern 15, but the length in the direction along the region 153 may be equal to or shorter than the height from the wiring pattern 15.

Providing this type of protrusion allows improvement in the positioning precision of the diode 12 and the FET 14 as well as prevention of misalignment during the manufacturing process to be realized. Note that the above groove, protrusion, or both may be provided in place of the recessed portion on the electrode 11 and the electrode 13.

Further, in the embodiment described above, the example illustrates the semiconductor device 10 having one each of the FET 14 and the diode 12 stacked, but the present invention is not limited to this, and a configuration may be provided wherein the semiconductor device 10 has two or more FETs and diodes stacked.

Figure 15A:
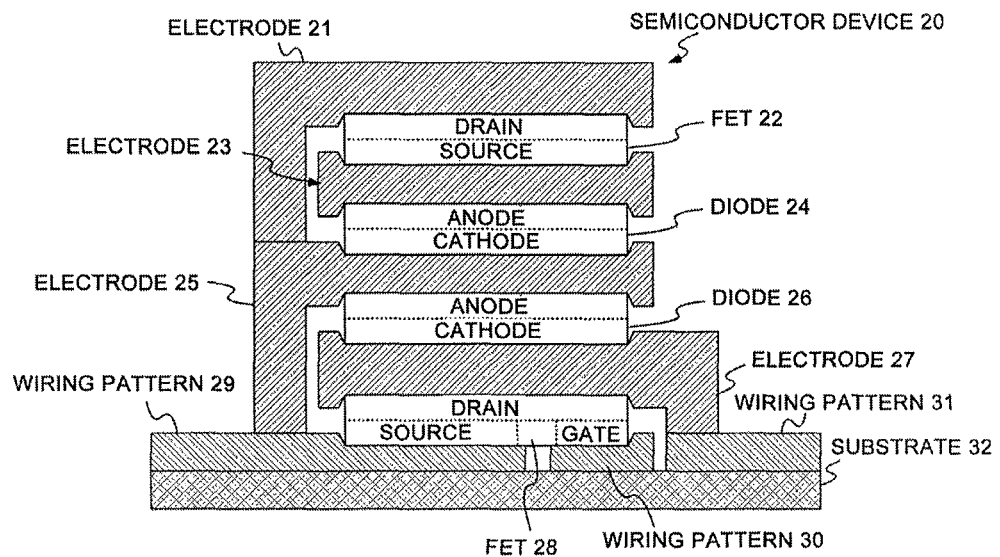
FIG. 15A is a cross-sectional view and FIG. 15B is a plan view illustrating one example of a structure of a semiconductor device 20 according to another embodiment of the present invention.
Figure 15B:
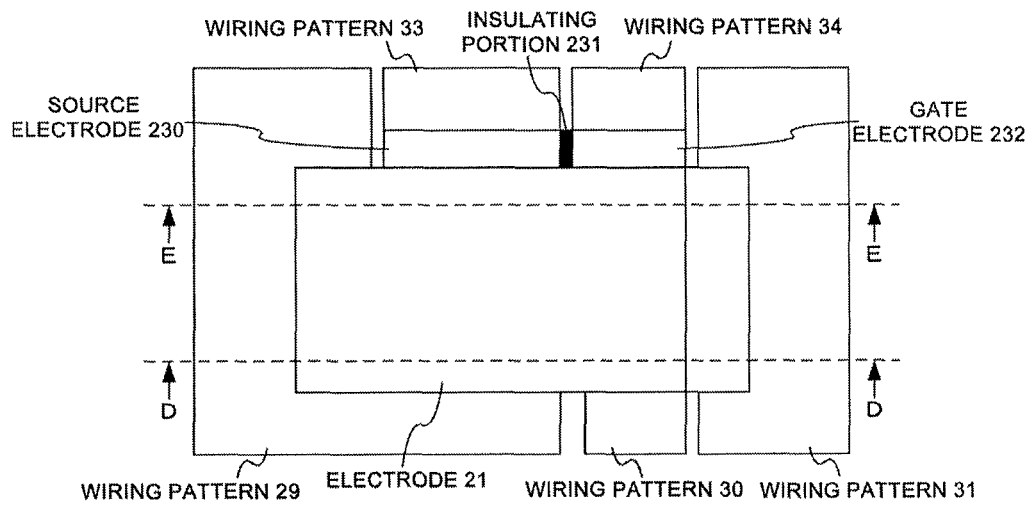
Figure 16:
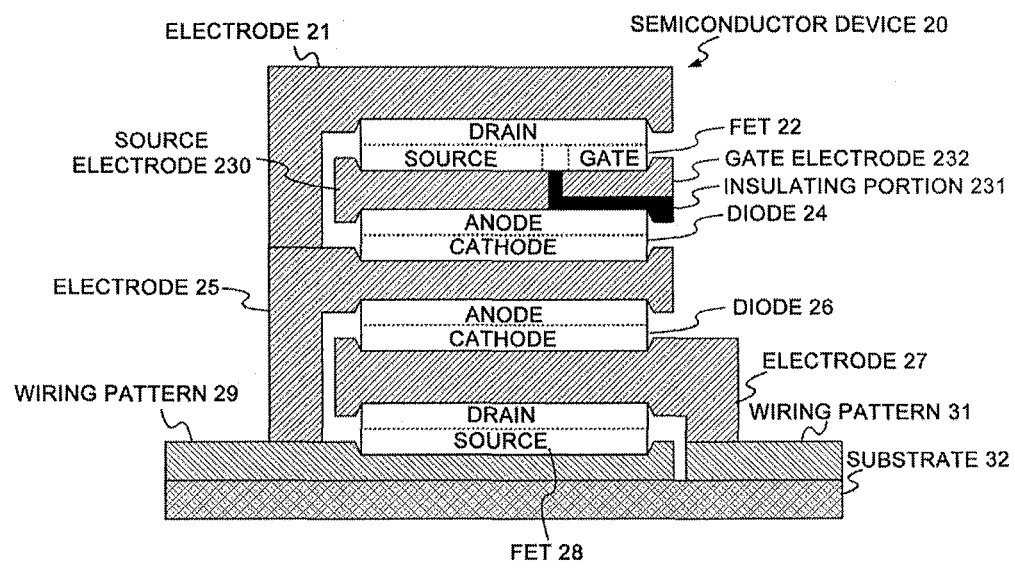
FIG. 16 is a cross-sectional view illustrating one example of a structure of the semiconductor device 20 according to another embodiment of the present invention.
Figure 17A:
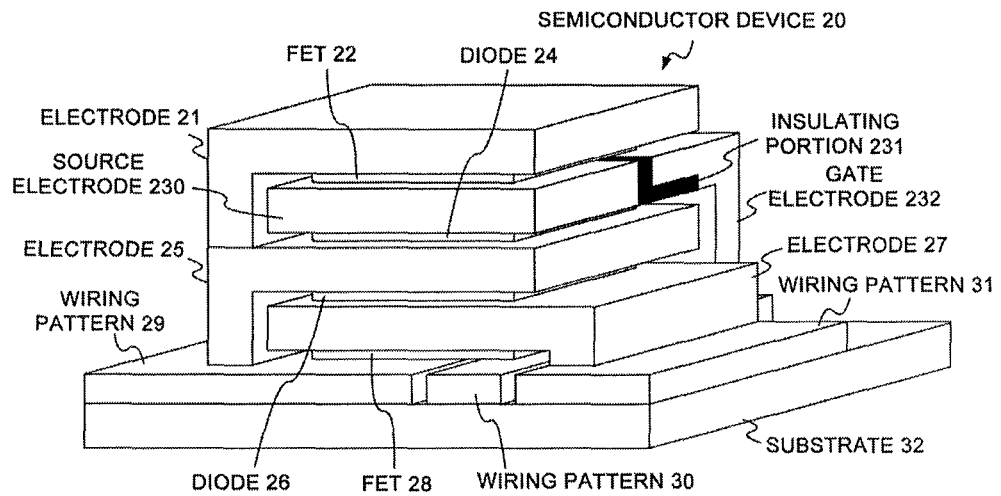
FIG. 17 is a perspective view illustrating one example of an outer appearance of the semiconductor device 20.

FIGS. 15 to 17 are conceptual diagrams illustrating one example of a structure of a semiconductor device 20 having a configuration where two each of an FET and a diode are stacked. FIG. 15B is a plan view of the semiconductor device 20, FIG. 15A is a cross-sectional view of the semiconductor device 20 of FIG. 15B along the line D-D, and FIG. 16 is a cross-sectional view of the semiconductor 20 of FIG. 15B along the line E-E.

The semiconductor device 20 is provided with an electrode 21, an FET 22, an electrode 23, a diode 24, an electrode 25, a diode 26, an electrode 27, an FET 28, a wiring pattern 29, a wiring pattern 30, a wiring pattern 31, a substrate 32, a wiring pattern 33, and a wiring pattern 34.

On the substrate 32 formed using a ceramic, such as aluminum nitride, having high thermal conductivity and insulating properties, the wiring pattern 29, the wiring pattern 30, the wiring pattern 31, the wiring pattern 33, and the wiring pattern 34 are formed using, for example, Cu and the like.

The FET 28 is formed in, for example, a plate-like shape, and the source of the FET 28 is bonded to a recessed portion of the wiring pattern 29 using a conductive bonding agent such as nano silver paste and the like, and the gate of the FET 28 is bonded to a recessed portion of the wiring pattern 30.

The electrode 27 is formed, for example, in a shape illustrated in FIG. 5 by, for example, Cu and the like, and one of the recessed portions is bonded to the drain of the FET 28 and the other recessed portion is bonded to the cathode of the diode 26, with the footing bonded to the wiring pattern 31, using the conductive bonding agent such as a nano silver paste and the like.

The diode 26 is formed, for example, in a plate-like shape, and the cathode provided on one surface is bonded to the recessed portion of the electrode 27, and the anode provided on the other surface is bonded to the recessed portion of the electrode 25 using the conductive bonding agent such as a nano silver paste and the like.

The electrode 25 is formed, for example, in a shape illustrated in FIG. 5 by, for example, Cu and the like, and one of the recessed portions is bonded to the anode of the diode 26 and the other recessed portion is bonded to the cathode of the diode 24, with the footing bonded to the wiring pattern 29, using the conductive bonding agent such as a nano silver paste and the like.

The diode 24 is formed, for example, in a plate-like shape, and the cathode provided on one surface is bonded to the recessed portion of the electrode 25 and the anode provided on the other surface is bonded to the recessed portion of the electrode 23 using the conductive bonding agent such as a nano silver paste and the like.

Figure 18A:
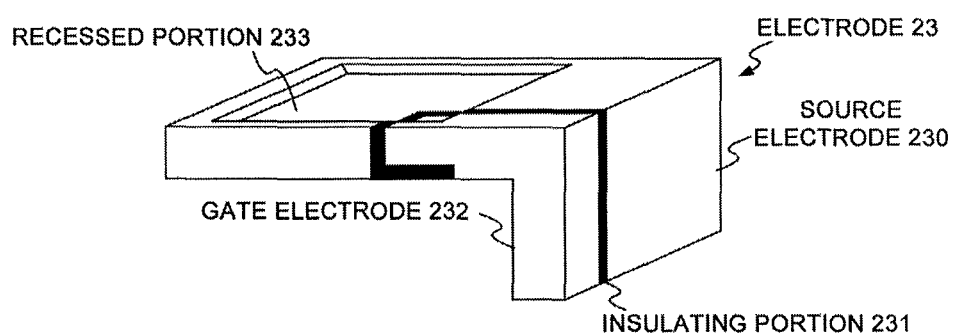
FIG. 18 is a conceptual diagram for explaining one example of a shape of an electrode 23.
Figure 18B:
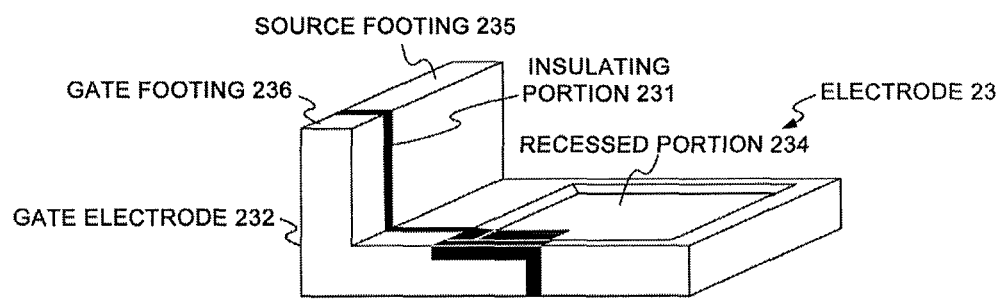

The electrode 23 is formed by, for example, Cu or the like, in a shape illustrated in, for example, FIG. 18. The electrode 23 has a source electrode 230, an insulating portion 231, and a gate electrode 232. For example, a recessed portion 233 such as that illustrated in FIG. 18A is formed on a surface of the electrode 23 connecting to the FET 22, and a recessed portion 234 such as that illustrated in FIG. 18B, for example, is formed on a surface connecting to the diode 24.

The source electrode 230 is connected to the anode of the diode 24 on the surface of the recessed portion 234 and is connected to the source of the FET 22 on a portion of the surface of the recessed portion 233. The gate electrode 232 is connected to the gate of the FET 22 on a portion of a surface of the recessed portion 233. The insulating portion 231 insulates between the source electrode 230 and the insulating portion 231.

Figure 17B:
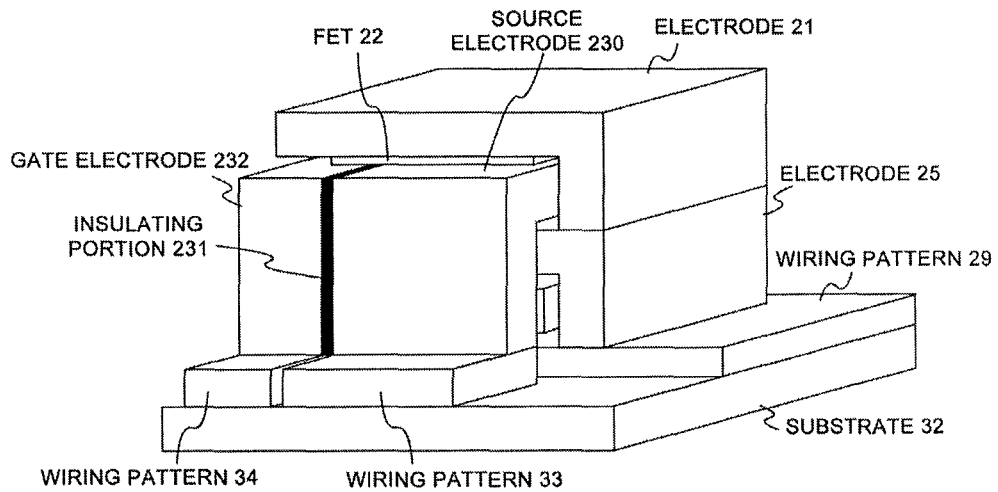

The source electrode 230 of the electrode 23 is connected to the wiring pattern 33 by the source footing 235, and the gate electrode 232 is connected to the wiring pattern 34 by the gate footing 236 (see FIG. 17B).

The FET 22 is formed in, for example, a plate-like shape, and the source of the FET 22 is bonded to insulating portion 231 of the electrode 23 and the gate of the FET 22 is bonded to the gate electrode 232 using a conductive bonding agent such as nano silver paste and the like.

The electrode 21 is formed, for example, in a shape illustrated in FIG. 6 by, for example, Cu and the like, and the recessed portion is bonded to the drain of the FET 22, and the footing is bonded to the electrode 25, using the conductive bonding agent such as a nano silver paste and the like.

Providing this type of structure in the circuitry illustrated in FIG. 2 allows, for example, the semiconductor device 10 to be configured in one semiconductor device 20 with two output units of each phase. Doing this enables further miniaturization of the circuitry illustrated in FIG. 2 to be realized.

Embodiments of the present invention were described above in detail, but the technical scope of the present invention is not limited to the scope described in the above embodiments. That various modifications or alterations can be applied to the embodiments described above is obvious to those skilled in the art. Further, such modified or altered forms are included in the technical scope of the present invention and are obvious from the description given in the claims.

REFERENCE NUMERALS

10 . . . Semiconductor device
11 . . . Electrode

12 . . . Diode
13 . . . Electrode
14 . . . FET
15 . . . Wiring pattern
16 . . . Wiring pattern
17 . . . Wiring pattern
18 . . . Substrate
19 . . . Semiconductor module
20 . . . Semiconductor device
21 . . . Electrode
22 . . . FET
23 . . . Diode
24 . . . Electrode
25 . . . Electrode
26 . . . Diode
27 . . . Electrode
28 . . . FET
29 . . . Wiring pattern
30 . . . Wiring pattern
31 . . . Substrate
32 . . . Wiring pattern
33 . . . Wiring pattern
34 . . . Substrate

What is claimed is:

1. A semiconductor device, comprising:
a field effect transistor (FET) provided on a substrate;
a first electrode provided on an opposite side of the substrate interposing the FET;
a diode provided on an opposite side of the FET interposing the first electrode; and
a second electrode provided on an opposite side of the first electrode interposing the diode;
wherein
the FET is formed in a plate-like shape having
a source and a gate provided on one surface and a drain provided on another surface,
the source is connected to a first wiring pattern on the substrate,
the gate is connected to a second wiring pattern on the substrate,
the drain is connected to the first electrode,
a footing of the first electrode is connected to a different wiring pattern than the first wiring pattern and the second wiring pattern on the substrate;
the diode is formed in a plate-like shape having
an anode provided on one surface and a cathode provided on another surface,
the cathode is connected to the first electrode,
the anode is connected to the second electrode,
a footing of the second electrode is connected to the first wiring pattern, and
the footing of the first electrode and the footing of the second electrode oppose each other interposing the FET.

2. A semiconductor device according to claim 1, wherein
the first electrode and the second electrode, in a cross section where the semiconductor device is cut on a plane orthogonal to the one surface of the FET including a line parallel to the side of the FET and that passes through the source and gate, is an L shape, and
the first electrode and the second electrode are provided so that a portion corresponding to the long side of the L shape is parallel to the substrate and a tip end of a portion corresponding to the short side of the L shape abuts a pattern on the substrate.

3. The semiconductor device according to claim 1, wherein
the first and second electrodes are at least partially a plate-like shaped electrode,
the first electrode
is connected to the FET on a surface of the drain for the FET and connected to the diode on a surface of the cathode for the diode,
the second electrode
is connected to the diode on a surface of the anode for the diode, and
the first wiring pattern
is connected to the FET on a surface of the source for the FET.

4. The semiconductor device according to claim 1, wherein
on the first electrode,
a groove or a protrusion is provided on a surface connected to the FET to align a position of the FET and the first electrode, and
a groove or a protrusion is provided on a surface connected to the diode to align a position of the diode and the first electrode, and
on the second electrode,
a groove or a protrusion is provided on a surface connected to the diode to align a position of the diode and the second electrode, and
on the first wiring pattern,
a groove or a protrusion is provided on a surface connected to the FET to align a position of the FET and the first wiring pattern.

5. The semiconductor device according to claim 1, wherein
the first electrode and the FET, the first electrode and the diode, the second electrode and the diode, and the first wiring pattern and the FET are respectively connected by a conductive bonding agent, and
a damming section is provided to suppress spreading of the conductive bonding agent on a side of the first electrode where the FET is connected and a side where the diode is connected, a side of the second electrode where the diode is connected, and on a side of the first wiring pattern where the FET is connected, respectively.

6. The semiconductor device according to claim 1, further comprising:
an insulating layer provided on an opposite side of the diode interposing the second electrode;
a heat sink provided on an opposite side of the second electrode interposing the insulating layer;
wherein,
the semiconductor device is resin sealed, and a portion of the heat sink on the opposite side of a surface contacting the insulating layer is exposed to the outside.

7. The semiconductor device according to claim 2, wherein
the first and second electrodes are at least partially a plate-like shaped electrode,
the first electrode
is connected to the FET on a surface of the drain for the FET and connected to the diode on a surface of the cathode for the diode,
the second electrode
is connected to the diode on a surface of the anode for the diode, and
the first wiring pattern
is connected to the FET on a surface of the source for the FET.

8. The semiconductor device according to claim 2, wherein
on the first electrode,
a groove or a protrusion is provided on a surface connected to the FET to align a position of the FET and the first electrode, and a groove or a protrusion is provided on a surface connected to the diode to align a position of the diode and the first electrode, and on the second electrode, a groove or a protrusion is provided on a surface connected to the diode to align a position of the diode and the second electrode, and on the first wiring pattern, a groove or a protrusion is provided on a surface connected to the FET to align a position of the FET and the first wiring pattern.

9. The semiconductor device according to claim 3, wherein on the first electrode, a groove or a protrusion is provided on a surface connected to the FET to align a position of the FET and the first electrode, and a groove or a protrusion is provided on a surface connected to the diode to align a position of the diode and the first electrode, and on the second electrode, a groove or a protrusion is provided on a surface connected to the diode to align a position of the diode and the second electrode, and on the first wiring pattern, a groove or a protrusion is provided on a surface connected to the FET to align a position of the FET and the first wiring pattern.

10. The semiconductor device according to claim 2, wherein the first electrode and the FET, the first electrode and the diode, the second electrode and the diode, and the first wiring pattern and the FET are respectively connected by a conductive bonding agent, and a damming section is provided to suppress spreading of the conductive bonding agent on a side of the first electrode where the FET is connected and a side where the diode is connected, a side of the second electrode where the diode is connected, and on a side of the first wiring pattern where the FET is connected, respectively.

11. The semiconductor device according to claim 3, wherein the first electrode and the FET, the first electrode and the diode, the second electrode and the diode, and the first wiring pattern and the FET are respectively connected by a conductive bonding agent, and a damming section is provided to suppress spreading of the conductive bonding agent on a side of the first electrode where the FET is connected and a side where the diode is connected, a side of the second electrode where the diode is connected, and on a side of the first wiring pattern where the FET is connected, respectively.

12. The semiconductor device according to claim 4, wherein the first electrode and the FET, the first electrode and the diode, the second electrode and the diode, and the first wiring pattern and the FET are respectively connected by a conductive bonding agent, and a damming section is provided to suppress spreading of the conductive bonding agent on a side of the first electrode where the FET is connected and a side where the diode is connected, a side of the second electrode where the diode is connected, and on a side of the first wiring pattern where the FET is connected, respectively.

13. A semiconductor device, comprising:

a field effect transistor (FET) provided on a substrate;

a first electrode provided on an opposite side of the substrate interposing the FET;

a diode provided on an opposite side of the FET interposing the first electrode; and a second electrode provided on an opposite side of the first electrode interposing the diode;

wherein the FET is formed in a plate-like shape having a source and a gate provided on one surface and a drain provided on another surface, the source is connected to a first wiring pattern on the substrate, the gate is connected to a second wiring pattern on the substrate, the drain is connected to the first electrode, the diode is formed in a plate-like shape having an anode provided on one surface and a cathode provided on another surface, the cathode is connected to the first electrode, the anode is connected to the second electrode, the second electrode is connected to the first wiring pattern, a surface of the first electrode connecting to the diode is larger than the FET and the diode, a length of the cathode, in a cross section where the semiconductor device is cut on a surface orthogonal to the one surface of the FET including a line parallel to the side of the FET that passes through the source and gate, is longer than the sum of the lengths of the source and the gate.

14. A semiconductor device according to claim 13, wherein the first electrode and the second electrode, in a cross section where the semiconductor device is cut on a plane orthogonal to the one surface of the FET including a line parallel to the side of the FET and that passes through the source and gate, is an L shape, and the first electrode and the second electrode are provided so that a portion corresponding to the long side of the L shape is parallel to the substrate and a tip end of a portion corresponding to the short side of the L shape abuts a pattern on the substrate.

15. The semiconductor device according to claim 13, wherein the first and second electrodes are at least partially a plate-like shaped electrode, the first electrode is connected to the FET on a surface of the drain for the FET and connected to the diode on a surface of the cathode for the diode, the second electrode is connected to the diode on a surface of the anode for the diode, and the first wiring pattern is connected to the FET on a surface of the source for the FET.

16. The semiconductor device according to claim 13, wherein on the first electrode, a groove or a protrusion is provided on a surface connected to the FET to align a position of the FET and the first electrode, and a groove or a protrusion is provided on a surface connected to the diode to align a position of the diode and the first electrode, and on the second electrode, a groove or a protrusion is provided on a surface connected to the diode to align a position of the diode and the second electrode, and on the first wiring pattern, a groove or a protrusion is provided on a surface connected to the FET to align a position of the FET and the first wiring pattern.

17. The semiconductor device according to claim 13, wherein
the first electrode and the FET, the first electrode and the diode, the second electrode and the diode, and the first wiring pattern and the FET are respectively connected by a conductive bonding agent, and
a damming section is provided to suppress spreading of the conductive bonding agent on a side of the first electrode where the FET is connected and a side where the diode is connected, a side of the second electrode where the diode is connected, and on a side of the first wiring pattern where the FET is connected, respectively.

18. The semiconductor device according to claim 13, further comprising:
an insulating layer provided on an opposite side of the diode interposing the second electrode;
a heat sink provided on an opposite side of the second electrode interposing the insulating layer;
wherein,
the semiconductor device is resin sealed, and a portion of the heat sink on the opposite side of a surface contacting the insulating layer is exposed to the outside.

19. A semiconductor device, comprising:
a first field effect transistor (FET) provided on a substrate;
a first electrode provided on an opposite side of the substrate interposing the first FET;
a first diode provided on an opposite side of the first FET interposing the first electrode; and
a second electrode provided on an opposite side of the first electrode interposing the first diode;
a second diode provided on an opposite side of the first diode interposing the second electrode;
a third electrode provided on an opposite side of the second electrode interposing the second diode;
a second FET provided on an opposite side of the second diode interposing the third electrode; and
a fourth electrode provided on an opposite side of the third electrode interposing the second FET;
wherein
the first and second FETs are formed in a plate-shape, respectively, with a source and gate provided on one surface and a drain provided on another surface,
the source of the first FET is connected to a first wiring pattern provided on the substrate,
the gate of the first FET is connected to a second wiring pattern provided on the substrate,
the drain of the first FET is connected to the first electrode,
a footing of the first electrode is connected to a different wiring pattern than the first wiring pattern and the second wiring pattern on the substrate,
the source of the second FET is connected to the third electrode,
the gate of the second FET is connected to a fifth electrode, and
the drain of the second FET is connected to the fourth electrode;
the first and second diodes are at least partially formed in a plate-shape, respectively, with an anode provided on one surface and a cathode provided on another surface,
the cathode of the first diode is connected to the first electrode,
the anode of the first diode is connected to the second electrode,
the cathode of the second diode is connected to the second electrode,
the anode of the second diode is connected to the third electrode,
a footing of the second electrode is connected to the first wiring pattern, and
a footing of the first electrode, the footing of the second electrode, and a footing of the fourth electrode oppose each other interposing the first FET, the second FET, the first diode, and the second diode.

20. A semiconductor device, comprising:
a first field effect transistor (FET) provided on a substrate;
a first electrode provided on an opposite side of the substrate interposing the first FET;
a first diode provided on an opposite side of the first FET interposing the first electrode; and
a second electrode provided on an opposite side of the first electrode interposing the first diode;
a second diode provided on an opposite side of the first diode interposing the second electrode; and
a third electrode provided on an opposite side of the second electrode interposing the second diode;
a second FET provided on an opposite side of the second diode interposing the third electrode; and
a fourth electrode provided on an opposite side of the third electrode interposing the second FET;
wherein
the first and second FETs are formed in a plate-shape, respectively, with a source and gate provided on one surface and a drain provided on another surface,
the source of the first FET is connected to a first wiring pattern provided on the substrate,
the gate of the first FET is connected to a second wiring pattern provided on the substrate,
the drain of the first FET is connected to the first electrode,
the source of the second FET is connected to the third electrode,
the gate of the second FET is connected to a fifth electrode, and
the drain of the second FET is connected to the fourth electrode;
the first and second diodes are at least partially formed in a plate-shape, respectively, with an anode provided on one surface and a cathode provided on another surface,
the cathode of the first diode is connected to the first electrode,
the anode of the first diode is connected to the second electrode,
the cathode of the second diode is connected to the second electrode,
the anode of the second diode is connected to the third electrode,
the second electrode, the fourth electrode, and the first wiring pattern are connected; and
a surface of the first electrode connecting to the first diode is larger than the FET and the first diode,
the length of the cathode of the first diode, in a cross-section where the semiconductor device is cut on a plane orthogonal to the one surface of the first FET including a line parallel to a side of the first FET and that passes through the source of the first FET and the gate of the first FET, is longer than the sum of the lengths of the source of the first FET and of the gate of the first FET.

* * * * *